United States Patent
Chen et al.

(10) Patent No.: US 9,472,734 B1
(45) Date of Patent: Oct. 18, 2016

(54) LIGHT-EMITTING DIODE DISPLAY

(71) Applicant: MIKRO MESA TECHNOLOGY CO., LTD., Apia (WS)

(72) Inventors: Li-Yi Chen, Tainan (TW); Chih-Hui Chan, Tainan (TW); Chun-Yi Chang, Tainan (TW); Pei-Yu Chang, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 14/846,843

(22) Filed: Sep. 7, 2015

(51) Int. Cl.
| | |
|---|---|
| *H01L 33/00* | (2010.01) |
| *H01L 21/00* | (2006.01) |
| *H01L 33/50* | (2010.01) |
| *H01L 33/60* | (2010.01) |

(52) U.S. Cl.
CPC ........... *H01L 33/505* (2013.01); *H01L 33/502* (2013.01); *H01L 33/60* (2013.01)

(58) Field of Classification Search
CPC .................................................... H01L 33/505
USPC ................................. 257/98, 89; 438/29–31
See application file for complete search history.

(56) References Cited

U.S. PATENT DOCUMENTS

| | | | |
|---|---|---|---|
| 9,202,982 B2 * | 12/2015 | Obata | H01L 33/38 |
| | | | 27/15 |
| 2014/0198373 A1 | 7/2014 | Ray | |
| 2014/0231849 A1 * | 8/2014 | Song | H01L 33/405 |
| | | | 257/98 |

FOREIGN PATENT DOCUMENTS

| | | |
|---|---|---|
| CN | 1218996 A | 6/1999 |
| CN | 103227189 A | 7/2013 |
| TW | I287887 B | 10/2007 |

\* cited by examiner

*Primary Examiner* — Calvin Lee
(74) *Attorney, Agent, or Firm* — CKC & Partners Co., Ltd.

(57) ABSTRACT

A LED display includes a bottom substrate, a first bottom electrode, a micro light emitting device, a wavelength conversion layer, an opposite electrode, and a first isolation layer. The first bottom electrode is disposed on the bottom substrate. The micro light emitting device is disposed on the first bottom electrode and includes at least one current controlling structure having at least one opening therein. The wavelength conversion layer covers the micro light emitting device, in which the wavelength conversion layer converts the light from a range of initial wavelengths into a range of predetermined wavelengths, and the range of predetermined wavelengths is greater than the range of initial wavelengths. The opposite electrode is electrically connected to the micro light emitting device. The first isolation layer is disposed between the micro light emitting diode and the opposite electrode to isolate the first bottom electrode and the opposite electrode.

20 Claims, 14 Drawing Sheets

LIGHT-EMITTING DIODE DISPLAY

BACKGROUND

1. Technical Field

The present disclosure relates to a light-emitting diode (LED) display.

2. Description of Related Art

In recent years, advances in LED technology have made dramatic improvements in luminance intensity and color fidelity. Due to theses improved technology, a full color LED display has become available and in common use.

Since a full color LED display gradually becomes mainstream in the display market, searching for better performance of a full color LED display becomes an important topic, and the display industries are starting to pay attention on it.

SUMMARY

This disclosure provides a light-emitting diode (LED) display which is capable of displaying full color images.

According to one or more embodiments of this disclosure, an LED display is provided. The LED display includes a bottom substrate, a first bottom electrode, at least one micro light emitting device, at least one wavelength conversion layer, an opposite electrode, and a first isolation layer. The first bottom electrode is disposed on the bottom substrate. The micro light emitting device is disposed on the first bottom electrode, in which the micro light emitting device includes at least one current controlling structure having at least one opening therein. The wavelength conversion layer covers the micro light emitting device, in which the wavelength conversion layer converts the light from a range of initial wavelengths into a range of predetermined wavelengths, and the range of predetermined wavelengths is greater than the range of initial wavelengths. The opposite electrode is electrically connected to the micro light emitting device. The first isolation layer is disposed between the micro light emitting diode and the opposite electrode and is configured to isolate the first bottom electrode and the opposite electrode.

By using the wavelength conversion layer, the light emitted from the micro light emitting device can be converted into different colors. As a result, a color image can be displayed according to the combination of different light colors.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
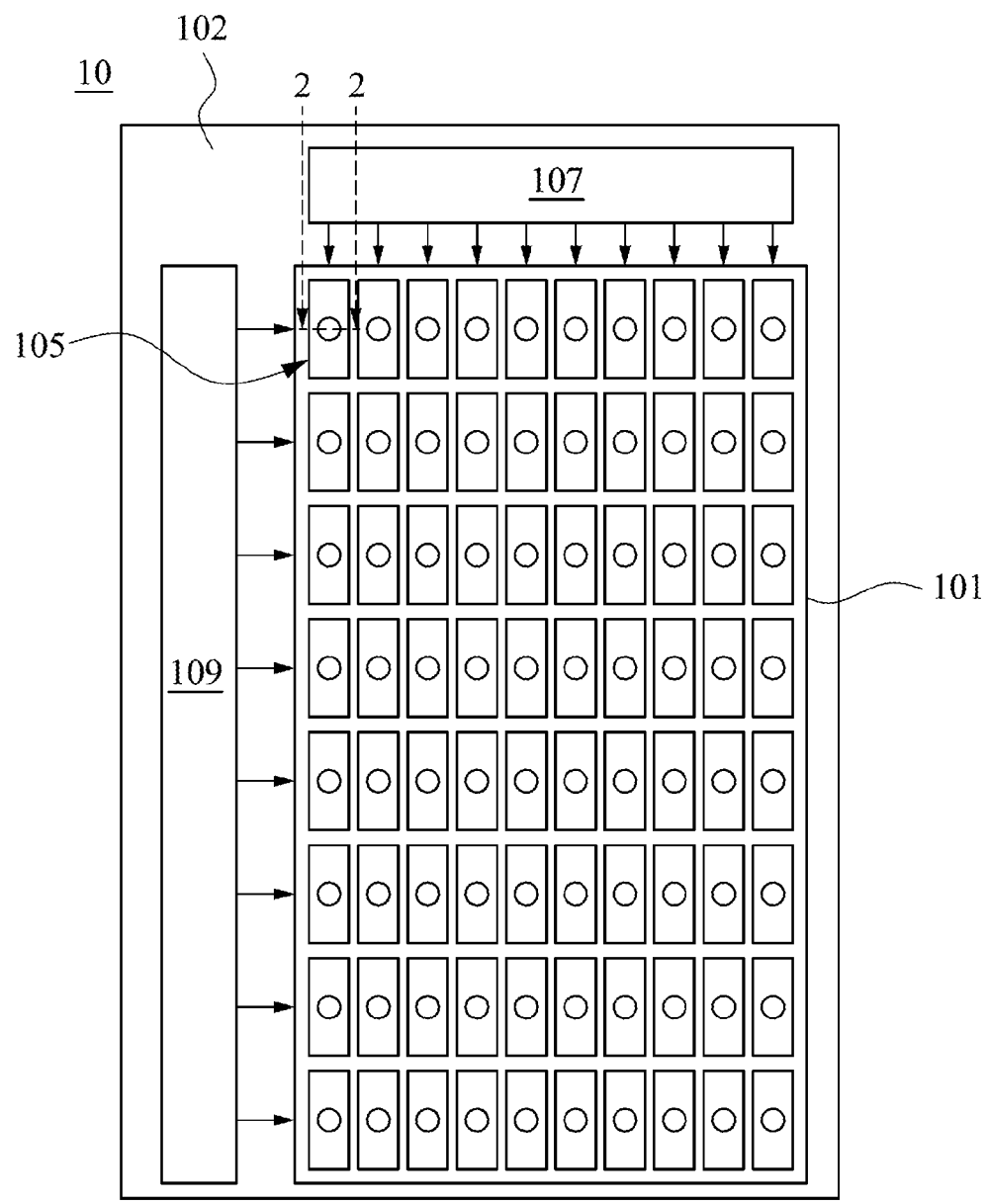
FIG. 1 is a top view of a light emitting diode (LED) display in accordance with various embodiments of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

It will be understood that when an element is referred to as being "on" another element, it can be directly on the other element or intervening elements may be present therebetween. In contrast, when an element is referred to as being "directly on" another element, there are no intervening elements present.

The terms "micro" device or "micro" LED as used herein may refer to the descriptive size of certain devices in accordance with embodiments of the present disclosure. As used herein, the terms "micro" device or "micro" LED are meant to refer to the scale of 1 micrometer to 1 millimeter. However, it is to be appreciated that embodiments of the present disclosure are not necessarily so limited, and that certain aspects of the embodiments may be applicable to larger, and possibly smaller size scales.

FIG. 1 is a top view of a light emitting diode (LED) display 10 in accordance with various embodiments of the present disclosure. As shown in FIG. 1, the LED display 10 includes a pixel area 101 and a non-pixel area 102 outside of the pixel area 101. The pixel area 101 includes an array of sub-pixels 105 arranged in a matrix. The non-pixel area 102 includes a data driver circuit 107 and a scan driver circuit 109. The data driver circuit 107 and the scan driver circuit 109 are electrically connected to each of the sub-pixels 105, so that the sub-pixels 105 can emit the light.

Figure 2:
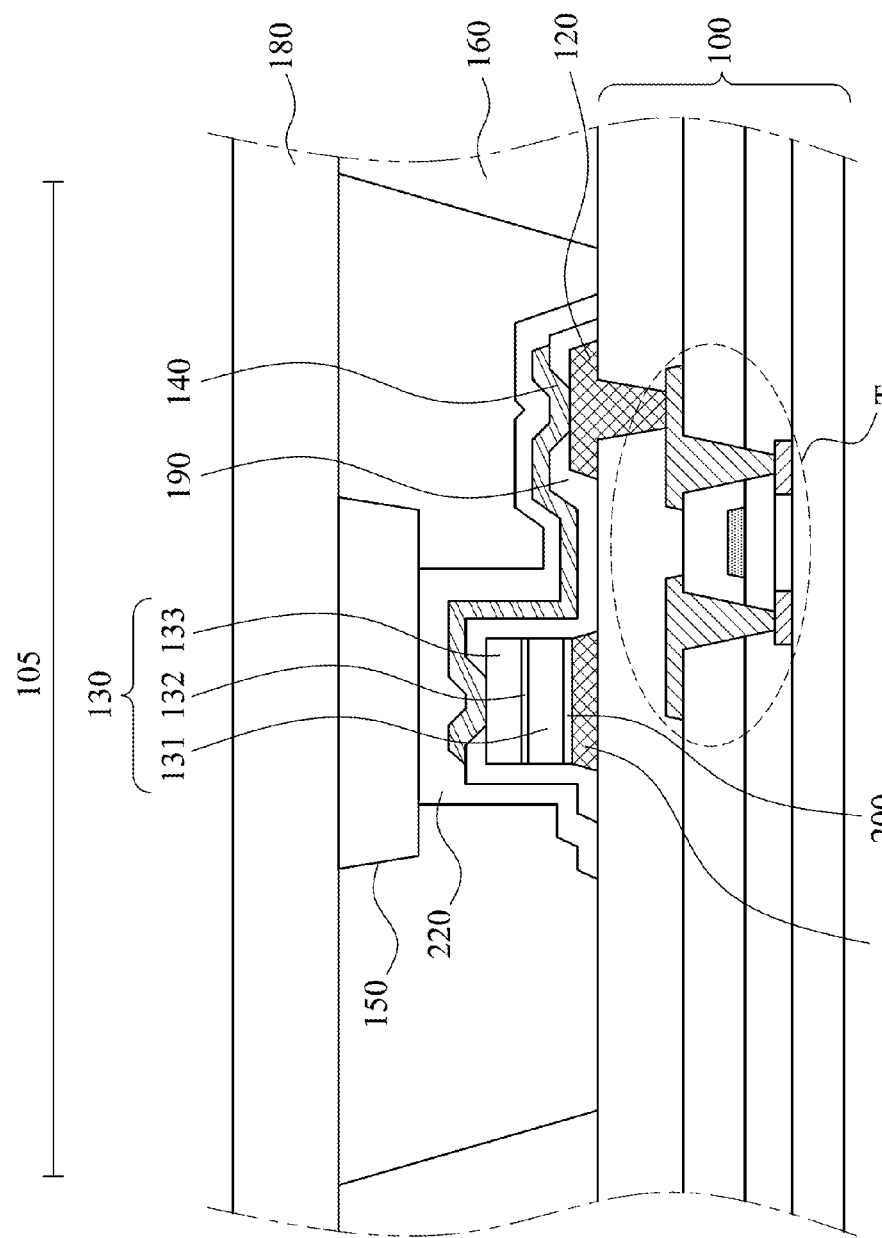
FIG. 2 is a cross-sectional view of line 2-2 in FIG. 1.

FIG. 2 is a cross-sectional view of line 2-2 in FIG. 1. The LED display 10 includes a bottom substrate 100, a first bottom electrode 110, a second bottom electrode 120, a micro light emitting device 130, an opposite electrode 140, a wavelength conversion layer 150, a pixel defining layer 160, a first isolation layer 190, and a switching unit T.

With reference made to FIG. 2, the pixel defining layer 160 defines an area of the sub-pixel 105. The first bottom electrode 110 and the second bottom electrode 120 are disposed on the bottom substrate 110 within the area of the sub-pixel 105. The first bottom electrode 110 and the second bottom electrode 120 are separated from each other, in which the second bottom electrode 120 is electrically connected to the switching unit T. The micro light emitting device 130 is disposed on the first bottom electrode 110. The first isolation layer 190 is formed on the micro light emitting device 130 and the second bottom electrode 120, in which the first isolation layer 190 exposes at least a part of the micro light emitting device 130 and at least a part of the second bottom electrode 120. The opposite electrode 140 is electrically connected to the exposed part of the micro light emitting device 130 and the exposed part of the second bottom electrode 120. The wavelength conversion layer 150 covers the micro light emitting device 130. In various embodiments, the light emitted from the micro light emitting device 130 has a range of initial wavelengths. The wavelength conversion layer 150 can covert the light from the range of initial wavelengths into a range of predetermined wavelengths, in which the range of predetermined wavelengths is greater than the range of initial wavelengths. More specifically, in different sub-pixels 150, the wavelength conversion layer 150 can convert the light from the range of initial wavelengths into different wavelength ranges of visible light. In various embodiments, the red, green, blue, yellow or cyan light may be emitted from the sub-pixels 105. As a result, a color image can be displayed according to the combination of different light colors.

Figure 3A:
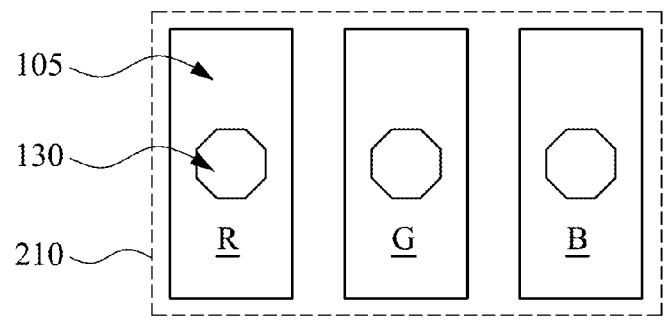
FIGS. 3A, 3B and 3C are partial enlarged views of FIG. 1.
Figure 3B:
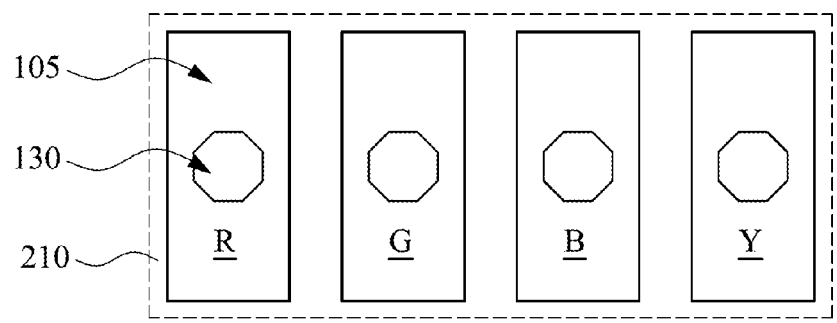
Figure 3C:
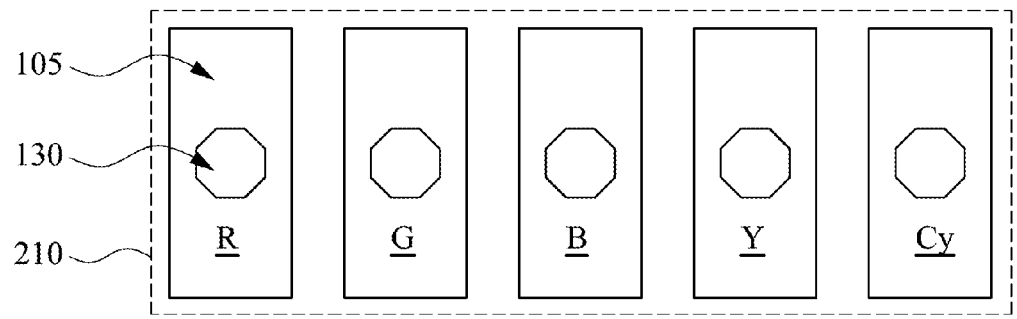

More specifically, in various embodiments, the micro light emitting device 130 may be a blue micro-LED. The range of initial wavelengths of the light emitted from the blue micro-LED may be 450 nm to 475 nm. The wavelength conversion layer 150 may convert the blue light into different light colors. For example, FIGS. 3A, 3B and 3C are partial enlarged views of FIG. 1. With reference made to FIGS. 3A-3C, a pixel unit 210 may include different colors of sub-pixels 105. More specifically, in the embodiment of FIG. 3A, the pixel unit 210 includes red, green, and blue sub-pixels R, G and B. In the embodiment of FIG. 3B, the pixel unit 210 includes red, green, blue and yellow sub-pixels R, G, B and Y. In the embodiment of FIG. 3C, the pixel unit 210 includes red, green, blue, yellow and cyan sub-pixels R, G, B, Y and Cy. It should be understood that, the sub-pixels 105 shown in FIGS. 3A, 3B and 3C have a strip type arrangement, but the present disclosure is not limited thereto. In some embodiments, the sub-pixels 105 shown in FIGS. 3A, 3B and 3C may have other types of arrangements, such as a delta type arrangement, a rectangular type arrangement, a mosaic type arrangement, etc.

In various embodiments, the wavelength conversion layer 150 inside the red sub-pixel R can convert the blue light into the red light, which may have the range of predetermined wavelengths from 620 nm to 750 nm. The wavelength conversion layer 150 inside the green sub-pixel R can convert the blue light into the green light, which may have the range of predetermined wavelengths from 495 nm to 570 nm. The wavelength conversion layer 150 inside the yellow sub-pixel Y can convert the blue light into the yellow light, which may have the range of predetermined wavelengths from 570 nm to 590 nm. The wavelength conversion layer 150 inside the cyan sub-pixel Cy can convert the blue light into the cyan light, which may have the range of predetermined wavelengths from 475 nm to 495 nm.

Although not illustrated, it should be understood that since the micro light emitting device 130 can emit the blue light, there may be no wavelength conversion layer 150 disposed inside the blue sub-pixel B, but the present disclosure is not limited thereto. In other embodiments, the micro light emitting device 130 may emit the ultraviolet light or the violet light, and there is a wavelength conversion layer 150 disposed inside the blue sub-pixel B for converting the ultraviolet light or the violet light into the blue light. In some embodiments, the ultraviolet light may have the wavelength ranged from 10 nm and 400 nm, and the violet light may have the wavelength ranged from 380 nm to 450 nm. The wavelength conversion layer 150 inside the blue sub-pixel B may convert the ultraviolet light or the violet light into the blue light, which may have the range of predetermined wavelengths from 450 nm to 475 nm.

In various embodiments, the wavelength conversion layer 150 may include a quantum dot material or a phosphor material embedded therein. The wavelength conversion layer 150 may emit different colors of light depending on the size of the quantum dot material or the composition of the phosphor material.

A quantum dot is a nanocrystal made of semiconductor materials that is small enough to exhibit quantum mechanical properties. Electronic characteristics of a quantum dot are closely related to its size and shape. For example, the band gap in a quantum dot which determines the frequency range of emitted light is inversely related to its size. In fluorescent dye applications the frequency of emitted light increases as the size of the quantum dot decreases. Consequently, the color of emitted light shifts from red to blue when the size of the quantum dot is made smaller. Furthermore, quantum dot assemblies consisting of many different sizes, such as gradient multi-layer nanofilms, can be made to exhibit a range of desirable emission properties.

By using the wavelength conversion layer 150 to convert monochrome color light emitted from the micro light emitting device 130 into different colors of light, a color image can be displayed according to the combination of different colors of light. Furthermore, different colors of micro light emitting device 130 may have different luminance efficiency. Therefore, by using the wavelength conversion layer 150 to convert the monochrome wavelength light into different colors, each of the sub-pixels can use the same color of the micro light emitting device 130 as the exciting light source. This will simplify the manufacturing process.

In various embodiments, the LED display 10 further includes a plurality of the micro light emitting devices 130 and a plurality of the wavelength conversion layers 150, in which the light emitted by each of the micro light emitting devices 130 is converted by a corresponding one of the wavelength conversion layers 150. That is, the wavelength conversion layers 150 convert the lights emitted by all of the micro light emitting devices 130. In some embodiments, each of the micro light emitting devices 130 corresponds to an individual wavelength conversion layer 150. In some embodiments, some of the micro light emitting devices 130 (e.g., the sub-pixels 105 emitting the same color of light) correspond to one of the wavelength conversion layers 150. For example, the lights emitted by the micro light emitting devices 130 in some adjacent red sub-pixels R can be converted by one of the wavelength conversion layers 150.

In various embodiments, the LED display 10 further includes a plurality of the micro light emitting devices 130 and a plurality of the wavelength conversion layers 150, in which the light emitted by each of some of the micro light emitting devices 130 is converted by a corresponding one of the wavelength conversion layers 150, and the lights emitted by the rest of the micro light emitting devices 130 are not converted by any one of the wavelength conversion layers 150. That is, the wavelength conversion layers 150 only convert the lights emitted by some of the micro light emitting devices 130. For example, the lights emitted by the micro light emitting devices 130 in all of the blue sub-pixels B are not converted by any one of the wavelength conversion layers 150. In some embodiments, each of the micro light emitting devices 130 collaborating with the wavelength conversion layer 150 corresponds to an individual wavelength conversion layer 150. In some embodiments, some of the micro light emitting devices 130 collaborating with the wavelength conversion layer 150 (e.g., the sub-pixels 105 emitting the same color of light) correspond to one of the wavelength conversion layers 150.

In the embodiment of FIG. 2, the LED display 10 further includes a top substrate 180. The top substrate 180 faces the bottom substrate 100. In various embodiments, the wavelength conversion layer 150 is disposed on the top substrate 180. More specifically, the wavelength conversion layer 150 is formed on the top substrate 180. Then, when the top substrate 180 is assembled onto the bottom substrate 100, the wavelength conversion layer 150 is aligned with the bottom substrate 100. In greater detail, an orthogonal projection of the wavelength conversion layer 150 on the bottom substrate 100 overlaps with an orthogonal projection of the micro light emitting device 130 on the bottom substrate 100, so that the wavelength conversion layer 150 can convert the wavelength of the light emitted from the micro light emitting device 130.

With reference made to FIG. 2, the LED display 10 may further include a second isolation layer 220. The second isolation layer 220 is disposed between the wavelength conversion layer 150 and the opposite electrode 140. In various embodiments, the refractive index of the second isolation layer 220 is greater than the refractive index of the wavelength conversion layer 150. The refractive index of the second isolation layer 220 is less than or equal to the refractive index of the first isolation layer 190. More specifically, the refractive index of the second isolation layer 220 may be ranged from 1.0 to 2.5. The refractive index of the wavelength conversion layer 150 may be ranged from 1.0 to 2.5. The refractive index of the first isolation layer 190 may be ranged from 1.2 to 2.5. By disposing the second isolation layer 220 between the wavelength conversion layer 150 and the opposite electrode 140, the light emitted from the micro light emitting device 130 can be more easily refracted into the wavelength conversion layer 150, thereby enhancing the light extraction efficiency of the micro light emitting device 130.

With reference made to FIG. 2, in various embodiments, the micro light emitting device 130 is a vertical type micro light emitting diode. More specifically, the micro light emitting device 130 may include a first type semiconductor layer 131, a second type semiconductor layer 133 and an active layer 132. As shown in FIG. 2, the first type semiconductor layer 131 is electrically connected to the first bottom electrode 110 through a conductive layer 200. The second type semiconductor layer 133 is electrically connected to the second bottom electrode 120 through the opposite electrode 140. The active layer 132 is disposed between the first type semiconductor layer 131 and the second type semiconductor layer 133.

It should be pointed out that the conductive layer 200 and the first bottom electrode 110 are bonded together and form an adhesive bonding system through a bonding process. Depending on the materials and compositions of the conductive layer 200 and/or the first bottom electrode 110, due to solid state equilibrium, the adhesive bonding system formed by the conductive layer 200 and/or the first bottom electrode 110 can have a relatively low bonding temperature. For example, the adhesive bonding system can be a eutectic system, a soldering contact, a transient liquid phase sintering system, even a conductive adhesive bonding systems, or the combination of above systems.

In some embodiments in which the adhesive bonding system is the eutectic system or the soldering contact. The eutectic point, the soldering point, the sintering point, or the conductive adhesive bonding temperature is lower than a melting point of one of the materials of the-first bottom electrode 110 and the conductive layer 200. In some embodiments, the conductive layer 200 is reflective, so the light reaches the bottom of the first type semiconductor layer 131 can be reflected toward the top substrate 180, thereby enhancing the luminance intensity of the LED display 10.

In some embodiments, the conductive layer 200 can be a metal layer or a conductive adhesive layer. To be specific, for the eutectic system, in some embodiments, the conductive layer 200 and the first bottom electrode 110 can be made of a mixture of indium and gold or a mixture of indium and silver with a determined ratio. For the soldering contact, the conductive layer 200 and the first bottom electrode 110 can both made of solder. For the TLPS system, the first bottom electrode 110 and the conductive layer 200 can be made of metal and solder respectively, such as silver and bismuth-tin alloy with a determined ratio, and the conductive layer 200 and the first bottom electrode 110 can bond and permeate together. For the conductive adhesive bonding system, the first bottom electrode 110 and the conductive layer 200 can be conductive adhesives, such as silver epoxy. As is known in the art, the first bottom electrode 110 and the conductive layer 200 can be made of various materials, and the detail illustration is omitted herein.

In some embodiments, the first type semiconductor layer 131 may be a N-type semiconductor layer, and the second type semiconductor layer 133 may be a P-type semiconductor layer. The first bottom electrode 110 may be a common electrode, and the second bottom electrode 120 may be a data electrode, but the present disclosure is not limited thereto. In other embodiments, the first type semiconductor layer 131 may be a P-type semiconductor layer, and the second type semiconductor layer 133 may be a N-type semiconductor layer. The first bottom electrode 110 may be a data electrode, and the second bottom electrode 120 may be a common electrode.

Figure 4:
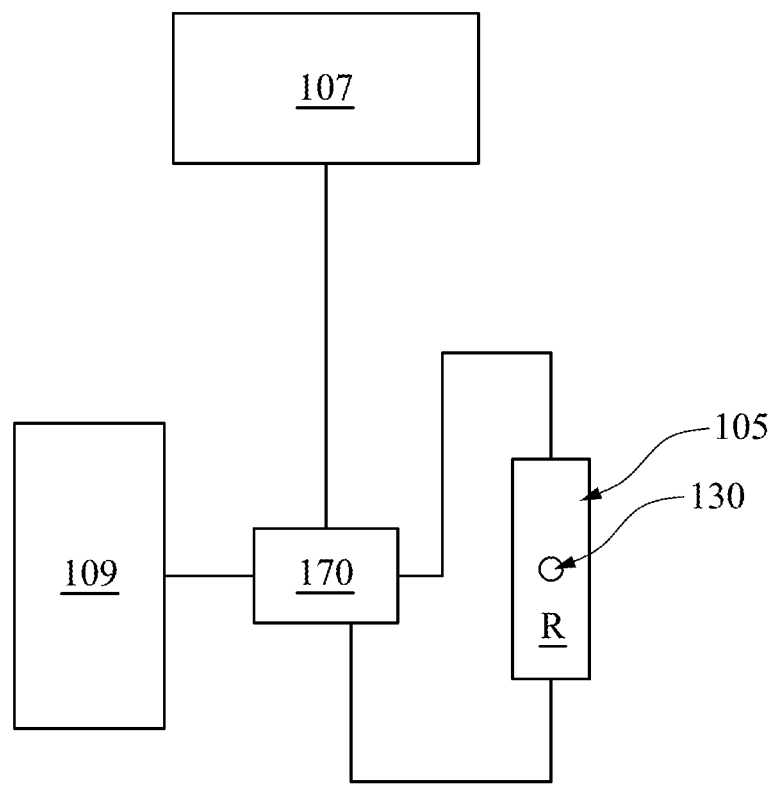
FIG. 4 is a block diagram of a sub-pixel in accordance with various embodiments of the present disclosure.

FIG. 4 is a block diagram of a sub-pixel 105 in accordance with various embodiments of the present disclosure. The LED display 10 may include a sub-pixel control circuit 170. The sub-pixel control circuit 170 is electrically connected to the scan driving circuit 109, the data driving circuit 107 and the sub-pixel 105, e.g. the red sub-pixel R, so as to control the emission of each of the sub-pixels 105. The sub-pixel control circuit 170 may include the switching unit T shown in FIG. 2. More specifically, in the embodiment of FIG. 2, the bottom substrate 100 may be an active device array substrate, and the switching unit T including a thin film transistor is formed within the bottom substrate 100. Although not illustrated in FIG. 2, the sub-pixel control circuit 170 may be electrically connected to the micro light emitting device 130 through the switching unit T, the first bottom electrode 110 and the second bottom electrode 120, so as to drive the emission of the micro light emitting device 120 through the data signals and the scan signals. The LED display 10 may be driven by either passive matrix address method or active matrix addressing method.

Figure 5:
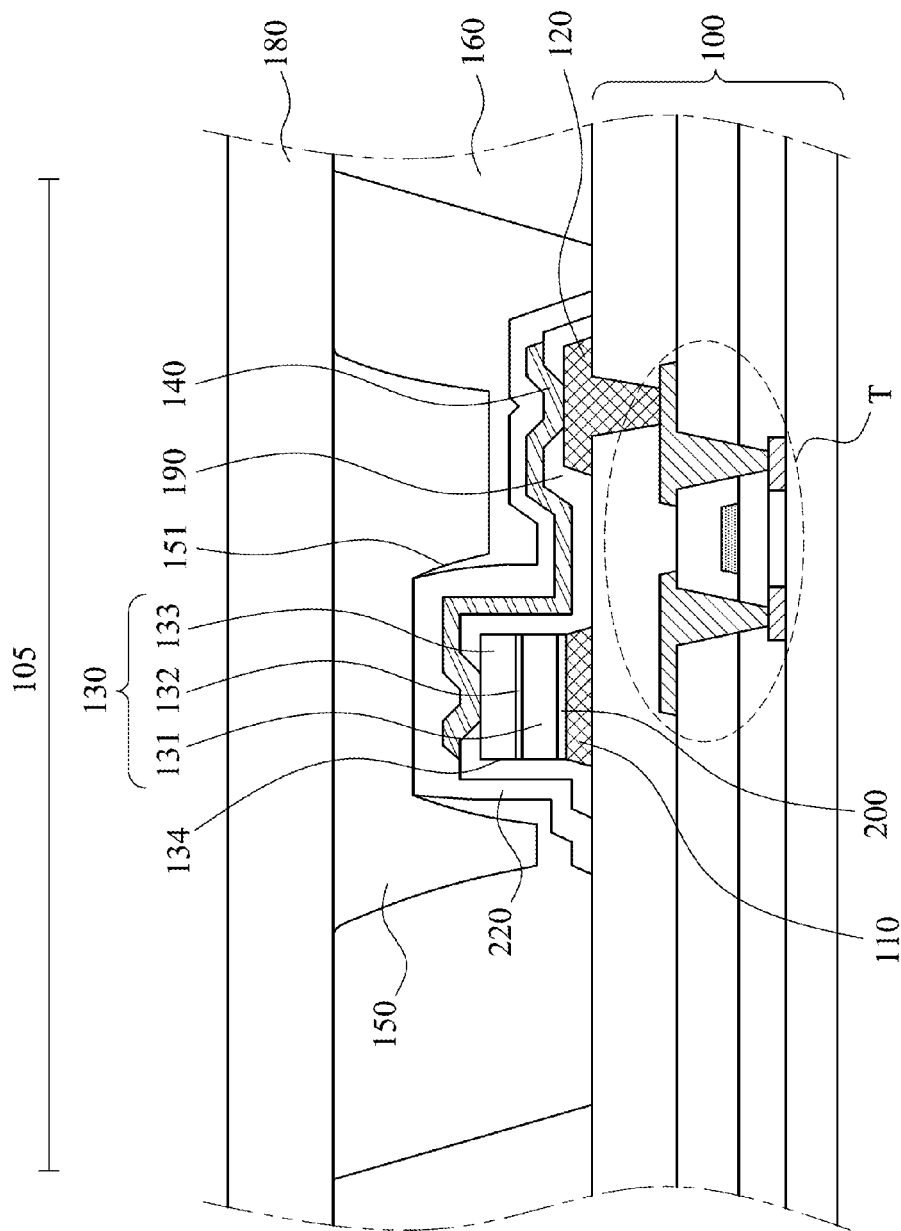
FIG. 5 is a cross-sectional view of an LED display in accordance with various embodiments of the present disclosure, in which the position of the cross section is the same as in FIG. 2.

FIG. 5 is a cross-sectional view of an LED display 10 in accordance with various embodiments of the present disclosure, in which the position of the cross section is the same as in FIG. 2. The difference between the embodiment of FIG. 5 and the embodiment of FIG. 2 is that the wavelength conversion layer 150 of FIG. 5 has a recess portion 151. The micro light emitting device 130 at least partially fits into the recess portion 151 of the wavelength conversion layer 150. More specifically, a side surface 134 of the micro light emitting device 130 at least fits into the recess portion 151 of the wavelength conversion layer 150. In other words, the recess portion 151 accommodates the side surface 134 of the micro light emitting device 130. As a result, the light emitted from the side surface 134 of the micro light emitting device 130 can be ensured to reach the wavelength conversion layer 150, thereby reducing the light that is not converted by the wavelength conversion layer 150 leaking from the sub-pixel 105.

Figure 6:
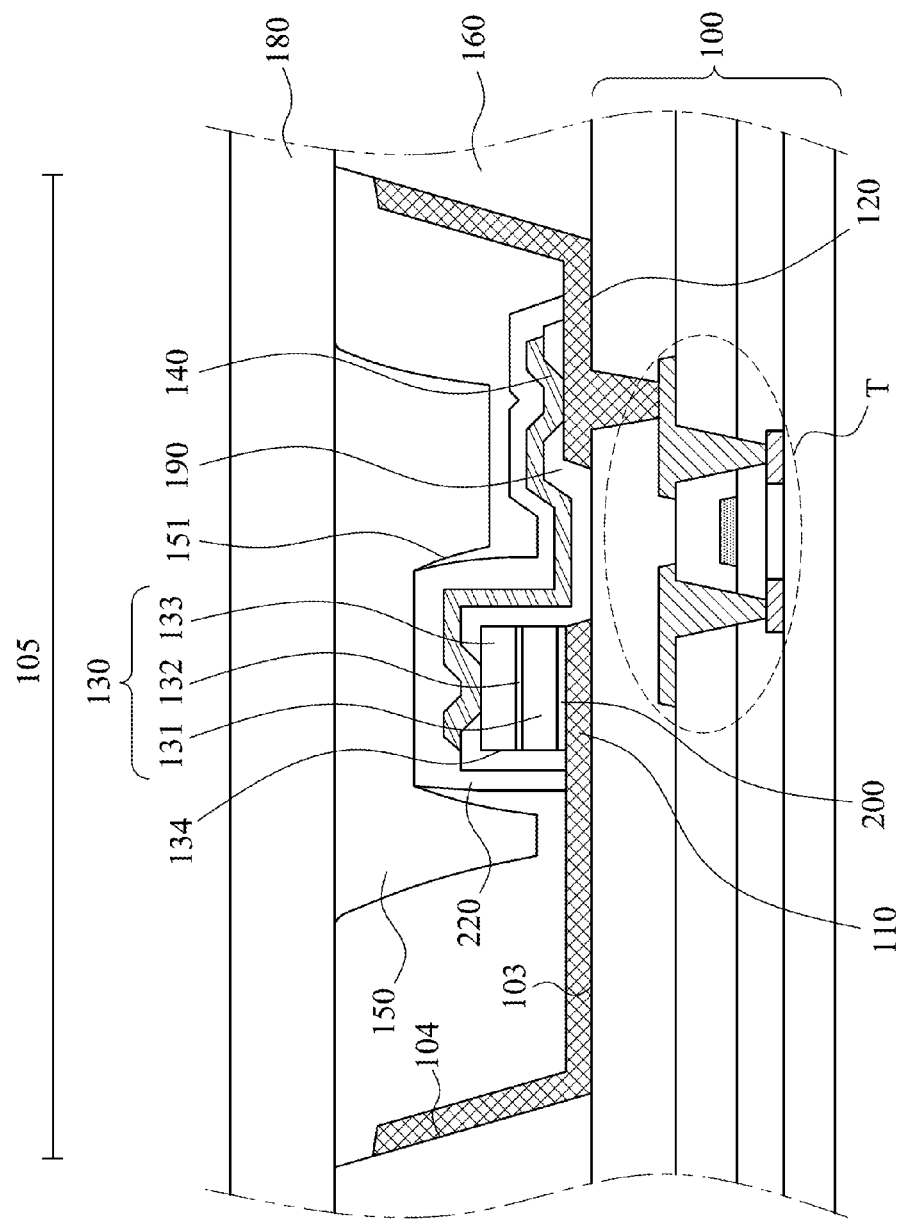
FIG. 6 is a cross-sectional view of an LED display in accordance with various embodiments of the present disclosure, in which the position of the cross section is the same as in FIG. 2.

FIG. 6 is a cross-sectional view of an LED display 10 in accordance with various embodiments of the present disclosure, in which the position of the cross section is the same as in FIG. 2. The difference between the embodiment of FIG. 6 and the embodiment of FIG. 5 is that the first bottom electrode 110 and the second bottom electrode 120 are reflective. Furthermore, the area of the sub-pixel 105 includes a bottom surface 103 and a tapered side surface 104 adjacent to the bottom surface 103. The first bottom electrode 110 and the second bottom electrode 120 cover at least a part of the bottom surface 103 and the tapered side surface 104. Since the first and second bottom electrodes 110, 120 are reflective, the light reaches the bottom surface 103 and the tapered side surface 104 can be reflected toward the top substrate 180, thereby enhancing the luminance intensity of the LED display 10.

Figure 7:
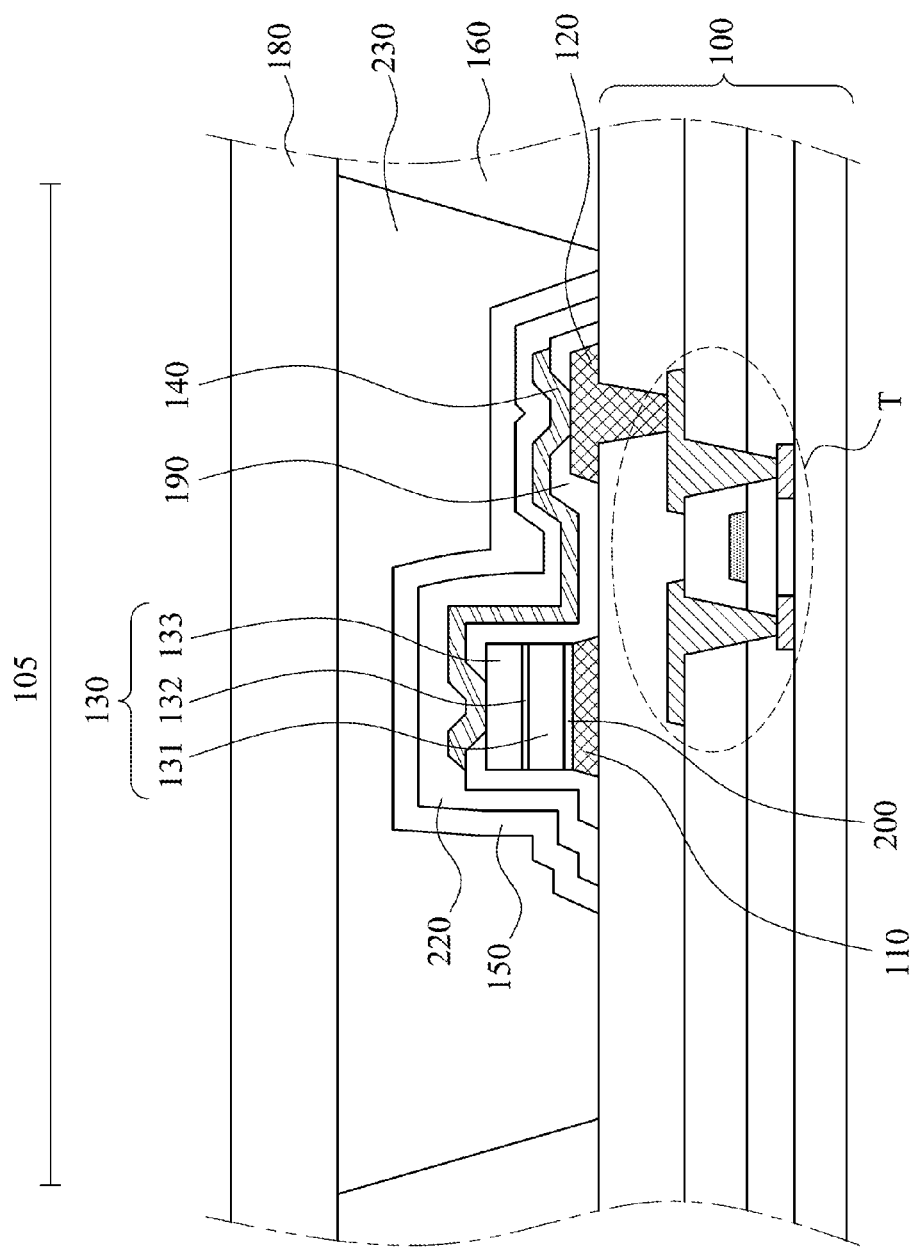
FIG. 7 is a cross-sectional view of an LED display in accordance with various embodiments of the present disclosure, in which the position of the cross section is the same as in FIG. 2.

FIG. 7 is a cross-sectional view of an LED display 10 in accordance with various embodiments of the present disclosure, in which the position of the cross section is the same as in FIG. 2. The difference between the embodiment of FIG. 7 and the embodiment of FIG. 5 is that the wavelength conversion layer 150 of FIG. 7 is formed on the bottom substrate 100, and the wavelength conversion layer 150 covers the micro light emitting device 130. In various embodiments, the LED display 10 may further include an encapsulation layer 230. The encapsulation layer 230 is disposed within the sub-pixel 105, and the encapsulation layer 230 covers the wavelength conversion layer 150, the micro light emitting device 130, the first bottom electrode 110, the second bottom electrode 120 and the opposite electrode 140. The top substrate 180 is disposed on the encapsulation layer 230. The encapsulation layer 230 can protect the whole micro light emitting package including the micro light emitting device 130, the wave length conversion layer 150, the first bottom electrode 110, the second bottom electrode 120, and the opposite electrode 140. Furthermore, in some embodiments, the encapsulation layer 230 may include light diffusion particles distributed therein, so that the light converted by the wavelength conversion layer 150 can be uniformly scattered inside the encapsulation layer 230.

Figure 8:
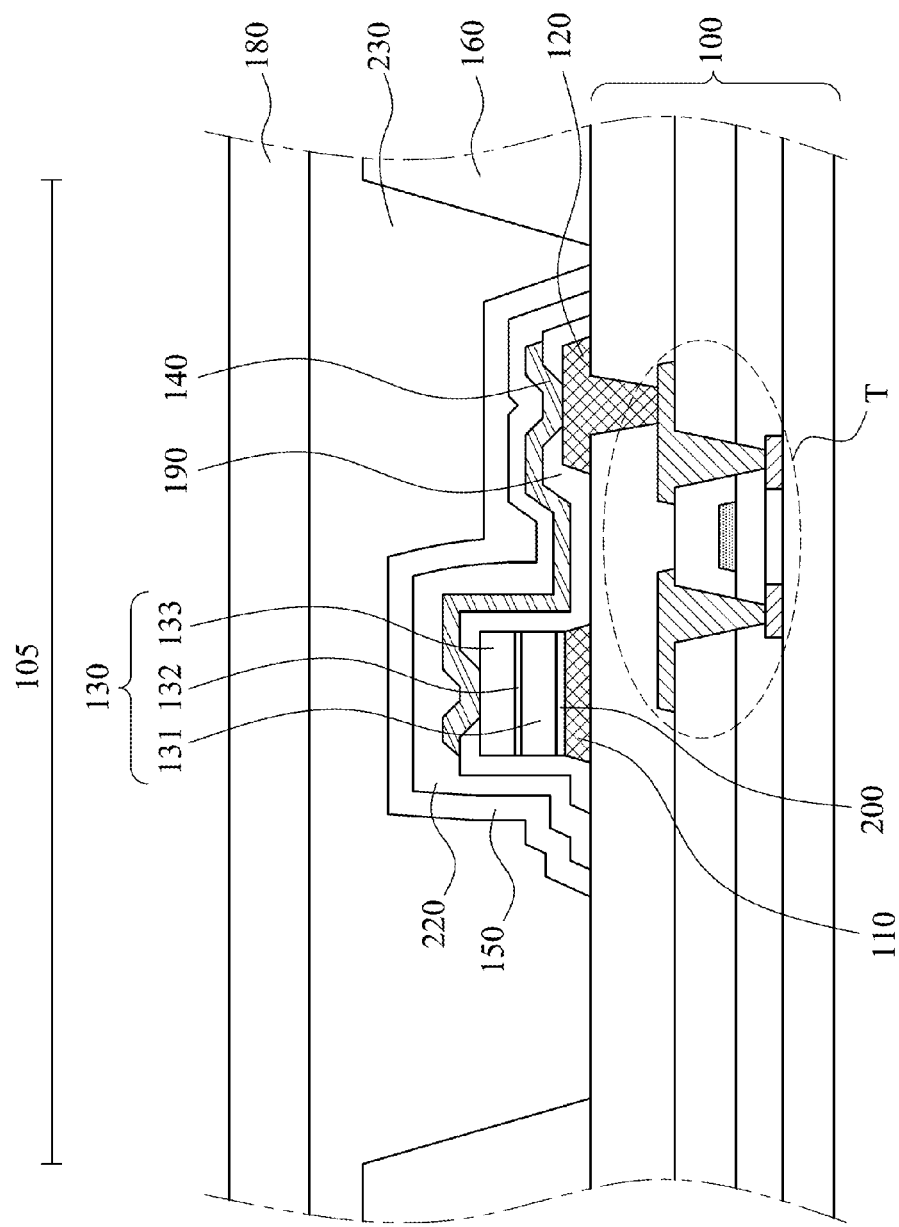
FIG. 8 is a cross-sectional view of an LED display in accordance with various embodiments of the present disclosure, in which the position of the cross section is the same as in FIG. 2.
Figure 9A:
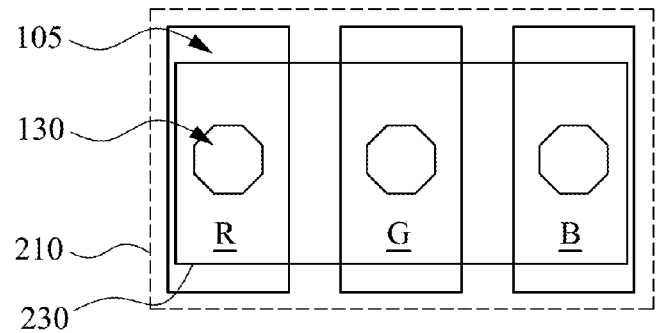
FIGS. 9A, 9B and 9C are partial enlarged views of FIG. 1 that shows the encapsulation layer covers the sub-pixels within the pixel unit.
Figure 9B:
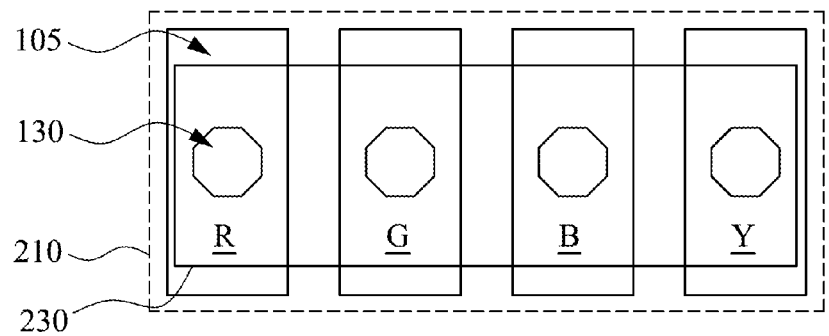
Figure 9C:
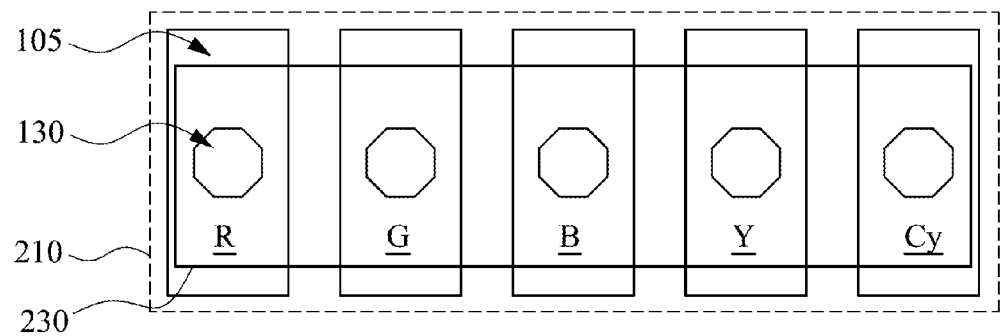

FIG. 8 is a cross-sectional view of an LED display 10 in accordance with various embodiments of the present disclosure, in which the position of the cross section is the same as in FIG. 2. The difference between the embodiment of FIG. 8 and the embodiment of FIG. 7 is that the encapsulation layer 230 of FIG. 8 covers the plurality of the sub-pixels 105, and the encapsulation layer 230 of FIG. 7 covers just one sub-pixel 105. More specifically, FIGS. 9A-9C are partial enlarged views of FIG. 1 that shows the encapsulation layer 230 covers the sub-pixels 105 within the pixel unit 210. For example, in FIG. 9A, the red, green and blue sub-pixels R, G and B are covered by the same encapsulation layer 230. In FIG. 9B, the red, green, blue and yellow sub-pixels R, G, B and Y are covered by the same encapsulation layer 230. In FIG. 9C, the red, green, blue, yellow and cyan are covered by the same encapsulation layer 230. As a result, the embodiment of FIG. 8 may have better light mixing effect since all the sub-pixels 105 within the pixel unit 210 shares the same encapsulation layer 230.

Figure 10A:
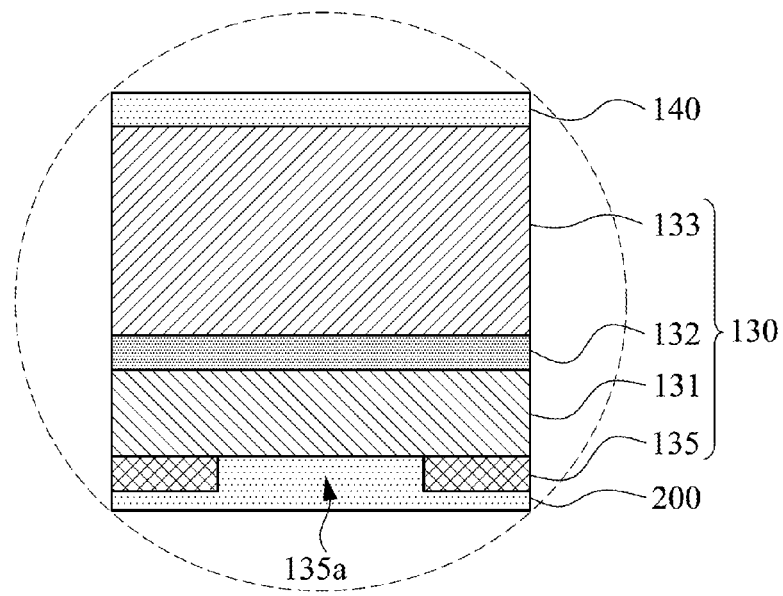
FIG. 10A an enlarged cross-sectional view of the micro light emitting device in FIG. 2 according to an embodiment of present disclosure.

FIG. 10A an enlarged cross-sectional view of the micro light emitting device 130 in FIG. 2 according to an embodiment of present disclosure. As shown in the FIG. 10A, the micro light emitting device 130 further includes a current controlling structure 135 having at least one opening 135a therein. The current controlling structure 135 is joined with the first type semiconductor layer 131. The conductive layer 200 is partially joined with the current controlling structure 135 and is electrically coupled with the exposed part of the first type semiconductor layer 131 through the opening 135a of the current controlling structure 135. The opening 135a of the current controlling structure 135 defines the contact area between the conductive layer 200 and the first type semiconductor layer 131. When the micro light emitting device 130 is forward biased, charge carriers flow from the contact area between the conductive layer 200 and the first type semiconductor layer 131 to the junction of the first type semiconductor layer 131 and the second type semiconductor layer 133 (i.e., the active layer 132).

The micro light emitting device 130 of the embodiment uses the current controlling structure 135 to limit the emitting area of the micro light emitting device 130. Since the opening 135a limits the area where the current goes into the micro light emitting device 130, the current density within the emitting area of the micro light emitting device 130 increases and can be uniform, thereby increasing the operating stability and efficiency of the micro light emitting device 130.

Furthermore, since the opening 135a of the current controlling structure 135 makes the emitting area of the micro light emitting device 130 smaller than the size of the micro light emitting device 130, it is possible to continue miniaturization of the emitting area of the micro light emitting device 130 while remain the size of the micro light emitting device 130 to be easier to handling in the manufacturing process.

Figure 10B:
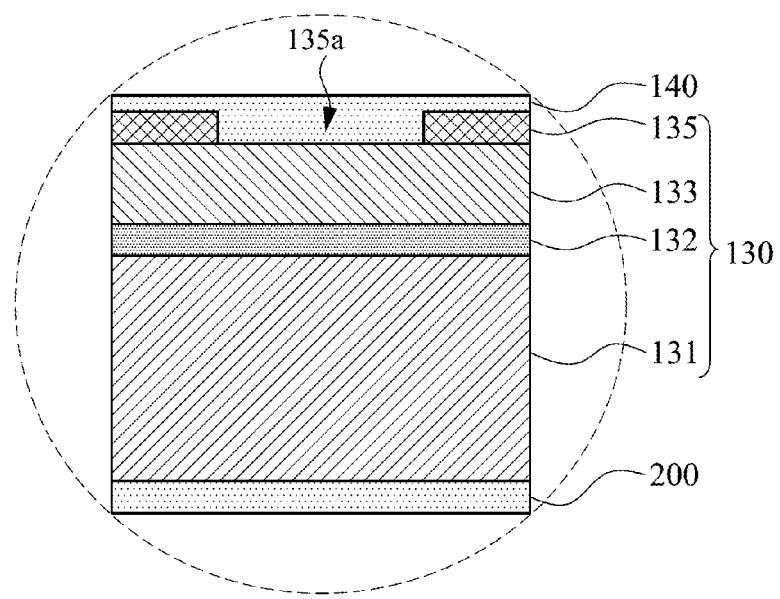
FIG. 10B an enlarged cross-sectional view of the micro light emitting device in FIG. 2 according to an embodiment of present disclosure.

FIG. 10B an enlarged cross-sectional view of the micro light emitting device in FIG. 2 according to an embodiment of present disclosure. As shown in the FIG. 10B, the difference between the micro light emitting device 130 of FIG. 10B and the micro light emitting device 130 of FIG. 10A is that the current controlling structure 135 of FIG. 10B is located at a side of the second type semiconductor layer 133 distal to the conductive layer 200. That is, the opening 135a of the current controlling structure 135 of FIG. 10B faces away from the bottom substrate 100. Other details regarding the micro light emitting device 130 of FIG. 10B are similar to the micro light emitting device 130 of FIG. 10A and therefore are not repeated here to avoid duplicity.

Figure 10C:
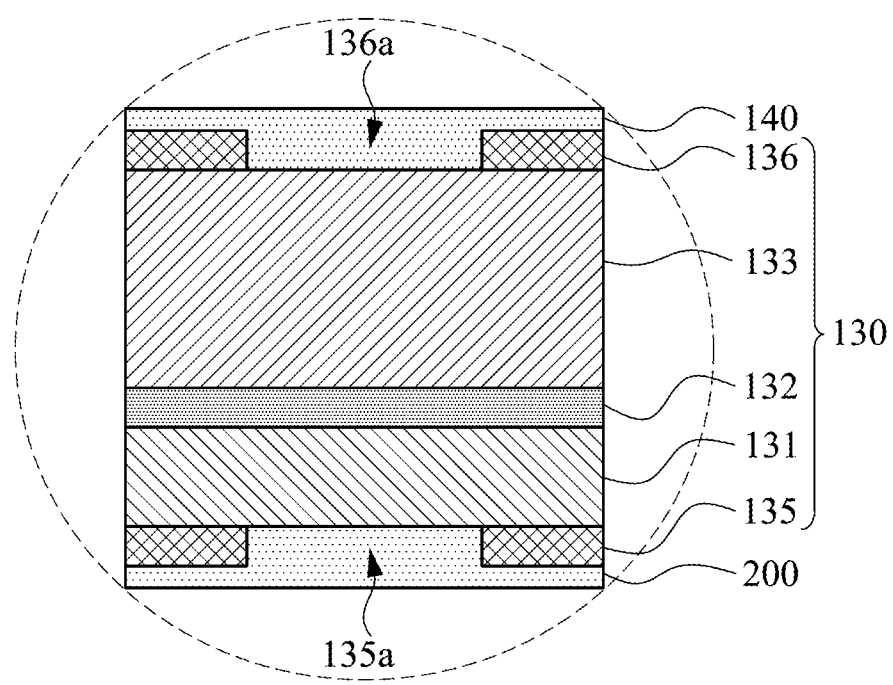
FIG. 10C an enlarged cross-sectional view of the micro light emitting device in FIG. 2 according to an embodiment of present disclosure.

FIG. 10C an enlarged cross-sectional view of the micro light emitting device in FIG. 2 according to an embodiment of present disclosure. As shown in the FIG. 10C, the difference between the micro light emitting device 130 of FIG. 10C and the micro light emitting device 130 of FIG. 10A is that the micro light emitting device 130 further includes the current controlling structure 136 located at a side of the second type semiconductor layer 133 distal to the conductive layer 200, in which the current controlling structure 136 has at least one opening 136a therein, and the opposite electrode 140 extends through the opening 136a of the current controlling structure 136 to be electrically coupled with the second type semiconductor layer 133. That is, the opening 136a of the current controlling structure 136 of FIG. 10C faces away from the bottom substrate 100. Other details regarding the micro light emitting device 130 of FIG. 10C are similar to the micro light emitting device 130 of FIG. 10A and therefore are not repeated here to avoid duplicity.

Figure 10D:
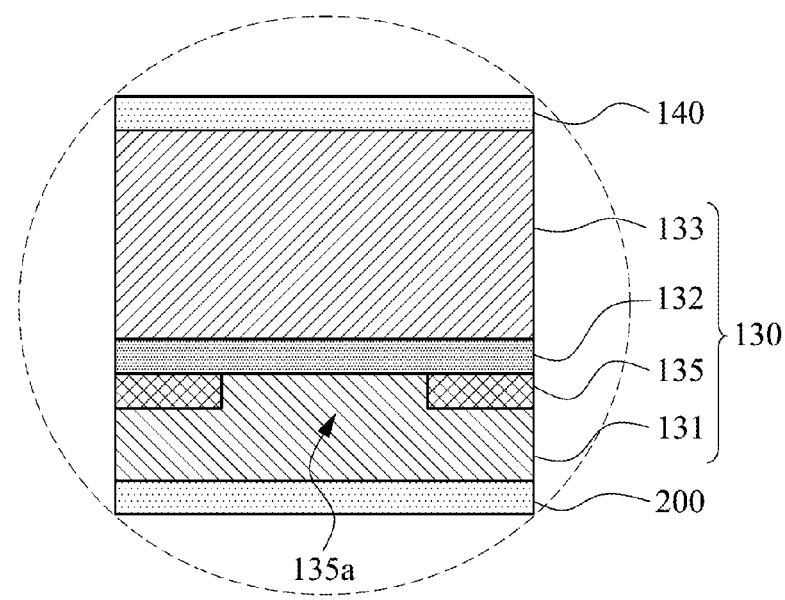
FIG. 10D an enlarged cross-sectional view of the micro light emitting device in FIG. 2 according to an embodiment of present disclosure.

FIG. 10D an enlarged cross-sectional view of the micro light emitting device in FIG. 2 according to an embodiment of present disclosure. As shown in the FIG. 10D, the difference between the micro light emitting device 130 of FIG. 10D and the micro light emitting device 130 of FIG. 10A is that the current controlling structure 135 of FIG. 10D is disposed between the first type semiconductor layer 131 and the active layer 132, and the current controlling structure 135 contacts the active layer 132. Other details regarding the micro light emitting device 130 of FIG. 10D are similar to the micro light emitting device 130 of FIG. 10A and therefore are not repeated here to avoid duplicity.

Figure 10E:
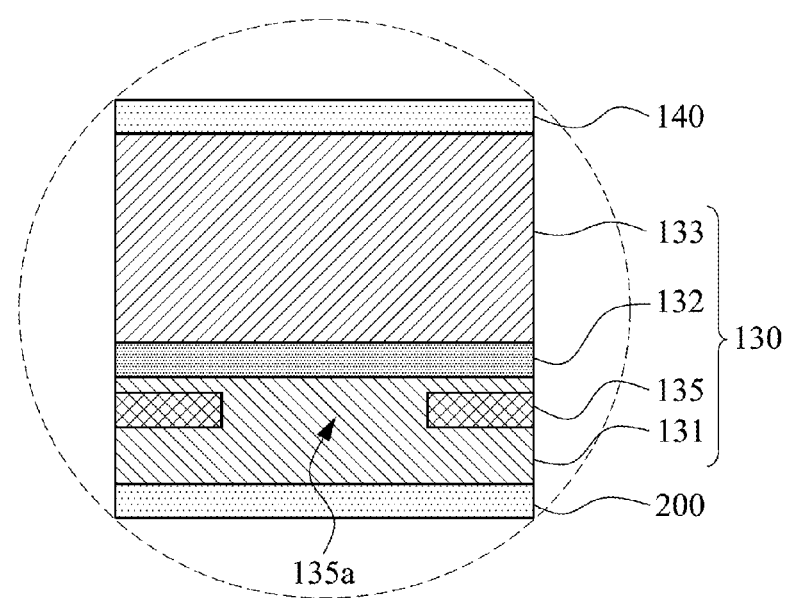
FIG. 10E an enlarged cross-sectional view of the micro light emitting device in FIG. 2 according to an embodiment of present disclosure.

FIG. 10E an enlarged cross-sectional view of the micro light emitting device in FIG. 2 according to an embodiment of present disclosure. As shown in the FIG. 10E, the difference between the micro light emitting device 130 of FIG. 10E and the micro light emitting device 130 of FIG. 10D is that the current controlling structure 135 of FIG. 10E is disposed in the first type semiconductor layer 131 without contacting the active layer 132. In this configuration, the first type semiconductor layer 131 may protect the active layer 132 while manufacturing the current controlling structure 135. Other details regarding the micro light emitting device 130 of FIG. 10E are similar to the micro light emitting device 130 of FIG. 10D and therefore are not repeated here to avoid duplicity.

Figure 10F:
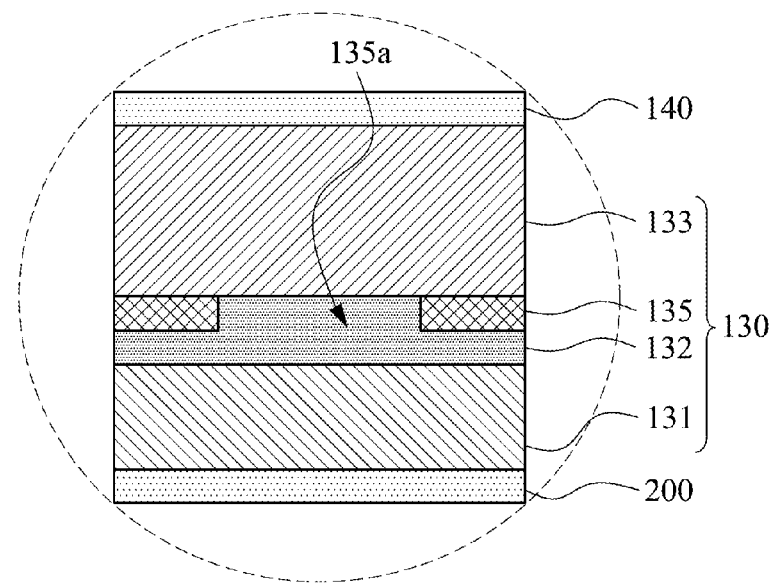
FIG. 10F an enlarged cross-sectional view of the micro light emitting device in FIG. 2 according to an embodiment of present disclosure.

FIG. 10F an enlarged cross-sectional view of the micro light emitting device in FIG. 2 according to an embodiment of present disclosure. As shown in the FIG. 10F, the differences between the micro light emitting device 130 of FIG. 10F and the micro light emitting device 130 of FIG. 10A are that the current controlling structure 135 of FIG. 10F is disposed between the active layer 132 and the second type semiconductor layer 133, and the current controlling structure 135 contacts the active layer 132. Other details regarding the micro light emitting device 130 of FIG. 10F are similar to the micro light emitting device 130 of FIG. 10A and therefore are not repeated here to avoid duplicity.

Figure 10G:
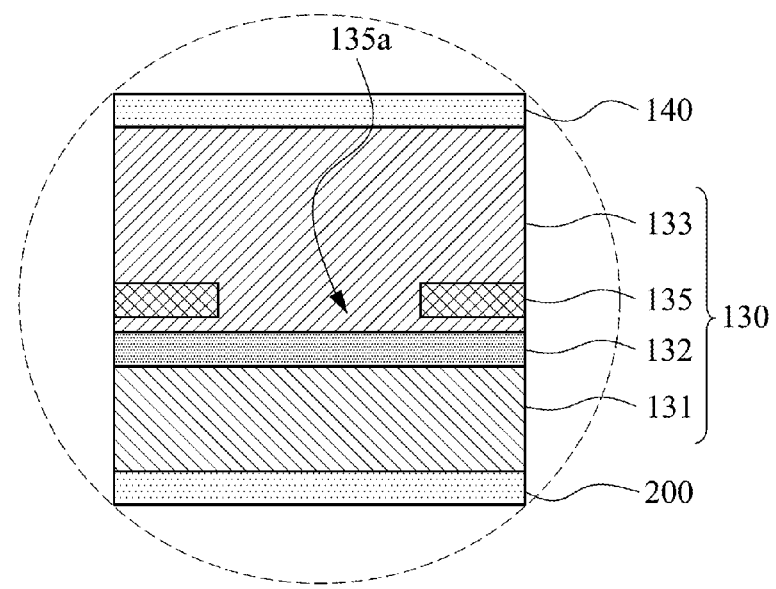
FIG. 10G an enlarged cross-sectional view of the micro light emitting device in FIG. 2 according to an embodiment of present disclosure.

FIG. 10G an enlarged cross-sectional view of the micro light emitting device in FIG. 2 according to an embodiment of present disclosure. As shown in FIG. 10G, the difference between the micro light emitting device 130 of FIG. 10G and the micro light emitting device 130 of FIG. 10F is that the current controlling structure 135 of FIG. 10G is disposed in the second type semiconductor layer 133 without contacting the active layer 132. Other details regarding the micro light emitting device 130 of FIG. 10G are similar to the micro light emitting device 130 of FIG. 10F and therefore are not repeated here to avoid duplicity.

Figure 10H:
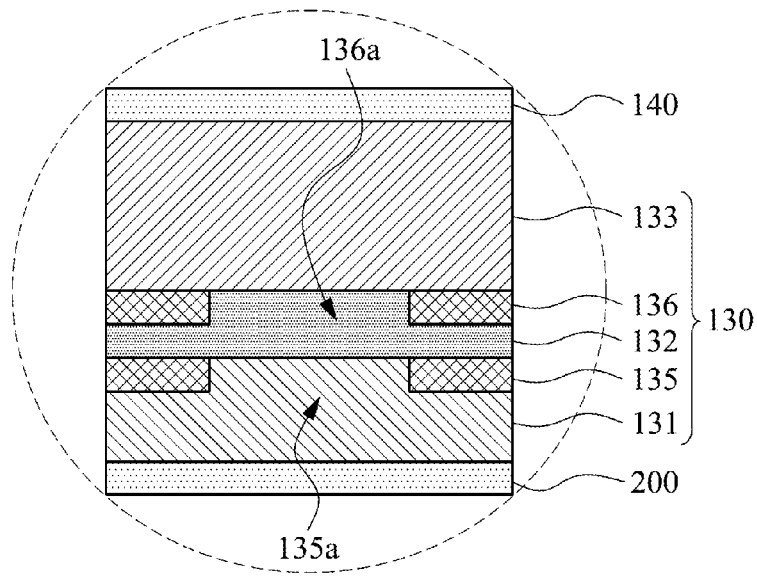
FIG. 10H an enlarged cross-sectional view of the micro light emitting device in FIG. 2 according to an embodiment of present disclosure.

FIG. 10H an enlarged cross-sectional view of the micro light emitting device in FIG. 2 according to an embodiment of present disclosure. As shown in FIG. 10H, the difference between the micro light emitting device 130 of FIG. 10H and the micro light emitting device 130 of FIG. 10D is that the micro light emitting device 130 of FIG. 10H further includes a current controlling structure 136 having at least one opening 136a therein. The current controlling structure 136 is disposed between the active layer 132 and the second type semiconductor layer 133. That is, the current controlling structures 135 and 136 are respectively located at opposite sides of the active layer 132. Other details regarding the micro light emitting device 130 of FIG. 10H are similar to the micro light emitting device 130 of FIG. 10D and therefore are not repeated here to avoid duplicity.

Figure 10I:
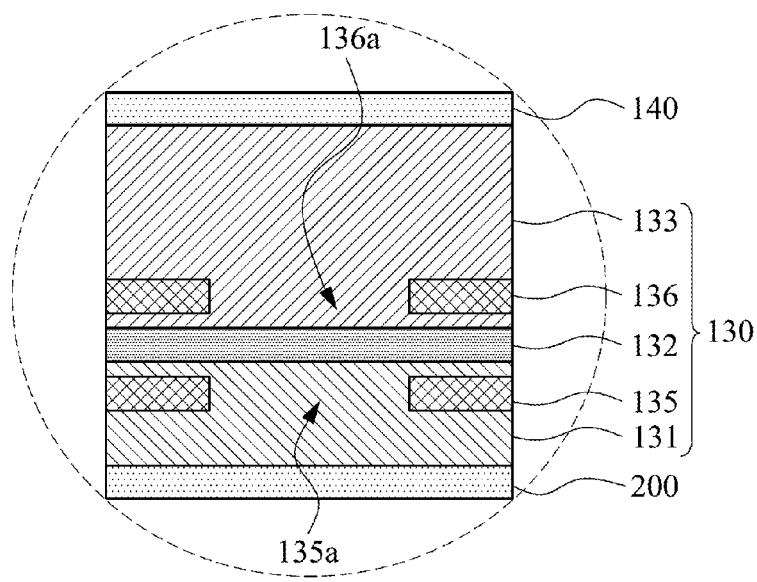
FIG. 10I an enlarged cross-sectional view of the micro light emitting device in FIG. 2 according to an embodiment of present disclosure.

FIG. 10I an enlarged cross-sectional view of the micro light emitting device in FIG. 2 according to an embodiment of present disclosure. As shown in FIG. 10I, the differences between the micro light emitting device 130 of FIG. 10I and the micro light emitting device 130 of FIG. 10D are that the current controlling structure 135 of FIG. 10I is disposed in the first type semiconductor layer 131 without contacting the active layer 132 and the current controlling structure 136 which has at least one opening 136a of FIG. 10I is disposed in the second type semiconductor layer 133 without contacting the active layer 132. In this configuration, the first type semiconductor layer 131 may protect the active layer 132 while manufacturing the current controlling structure 135. Other details regarding the micro light emitting device 130 of FIG. 10I are similar to the micro light emitting device 130 of FIG. 10H and therefore are not repeated here to avoid duplicity.

In some embodiments, only one of the current controlling structures 135 and 136 is formed to contact the active layer 132, and the other one of the current controlling structures 135 and 136 is formed without contacting the active layer 132.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims is not intended to invoke the provisions of 35 U.S.C. §112, 6th paragraph.

What is claimed is:

1. A light emitting diode (LED) display, comprising:
   a bottom substrate comprising at least one pixel unit, wherein the pixel unit comprises a plurality of sub-pixels;
   a first bottom electrode disposed on the bottom substrate;
   at least one micro light emitting device disposed on the first bottom electrode, wherein the micro light emitting device comprises at least one current controlling structure having at least one opening therein, wherein the micro light emitting device is disposed inside one of the sub-pixels;
   at least one wavelength conversion layer covering the micro light emitting device, wherein the wavelength conversion layer converts the light from a range of initial wavelengths into a range of predetermined wavelengths, and the range of predetermined wavelengths is greater than the range of initial wavelengths;
   an opposite electrode electrically connected to the micro light emitting device; and
   a first isolation layer disposed between the micro light emitting diode and the opposite electrode and configured to isolate the first bottom electrode and the opposite electrode.

2. The LED display of claim 1, wherein the wavelength conversion layer comprises a quantum dot material.

3. The LED display of claim 1, wherein the wavelength conversion layer comprises a phosphor material embedded therein.

4. The LED display of claim 1, further comprising a plurality of the micro light emitting devices and a plurality of the wavelength conversion layers, wherein the light emitted by each of the micro light emitting devices is converted by a corresponding one of the wavelength conversion layers.

5. The LED display of claim 1, further comprising a plurality of the micro light emitting devices and a plurality of the wavelength conversion layers, wherein the light emitted by each of some of the micro light emitting devices is converted by a corresponding one of the wavelength conversion layers, and the lights emitted by the rest of the micro light emitting devices are not converted by any one of the wavelength conversion layers.

6. The LED display of claim 1, further comprising:
   a second isolation layer disposed between the wavelength conversion layer and the opposite electrode.

7. The LED display of claim 1, further comprising a top substrate facing the bottom substrate, wherein the wavelength conversion layer is disposed on the top substrate, and an orthogonal projection of the wavelength conversion layer on the bottom substrate overlaps with an orthogonal projection of the micro light emitting device on the bottom substrate.

8. The LED display of claim 7, wherein the wavelength conversion layer has a recess portion, and the micro light emitting device at least partially fits into the recess portion.

9. The LED display of claim 1, further comprising:
   an encapsulation layer covering the wavelength conversion layer.

10. The LED display of claim 9, wherein the encapsulation layer covers the plurality of the sub-pixels.

11. The LED display of claim 9, further comprising a top substrate disposed on the encapsulation layer.

12. The LED display of claim 1, further comprising:
    a second bottom electrode disposed on the bottom substrate;
    wherein the opposite electrode is electrically connected to the second bottom electrode, and the first bottom electrode and the second bottom electrode are electrically connected to a sub-pixel control circuit.

13. The LED display of claim 12, further comprises a pixel defining layer to define an area of a sub-pixel, the area of the sub-pixel includes a bottom surface, wherein the first bottom electrode and the second bottom electrode are reflective and cover at least a part of the bottom surface.

14. The LED display of claim 12, wherein the micro light emitting device comprises:
    a first type semiconductor layer electrically connected to the first bottom electrode;
    a second type semiconductor layer electrically connected to the second bottom electrode; and
    an active layer disposed between the first type semiconductor layer and the second type semiconductor layer, wherein the current controlling structure is joined with one of the first type semiconductor layer and the second type semiconductor layer.

15. The LED display of claim 14, wherein the current controlling structure is joined with the first type semiconductor layer, and the first bottom electrode is electrically coupled with the first type semiconductor layer through the opening of the current controlling structure.

16. The LED display of claim 14, wherein the current controlling structure is disposed between at least a part of the first type semiconductor layer and the active layer.

17. The LED display of claim 14, wherein the current controlling structure is joined with the second type semiconductor layer, and the opposite electrode is electrically coupled with the second type semiconductor layer through the opening of the current controlling structure.

18. The LED display of claim 14, wherein the current controlling structure is disposed between at least a part of the second type semiconductor layer and the active layer.

19. The LED display of claim 14, further comprising:
    a conductive layer disposed between the micro light emitting device and the first bottom electrode and electrically coupled with the first type semiconductor layer and the first bottom electrode.

20. The LED display of claim 19, wherein the conductive layer is a metal layer or a conductive adhesive layer.

* * * * *